DIMINISHING MARK WEAROUT DURING TERMINAL FORMATION

Filed April 26, 1971

INVENTOR
JAMES W. TUTTLE
BY Joseph L. Spiegel
Harry M Weiss
ATTORNEYS 3,764,379
Patented Oct. 9, 1973

3,764,379

DIMINISHING MASK WEAROUT DURING TERMINAL FORMATION

James W. Tuttle, Wappingers Falls, N.Y., assignor to Cogar Corporation, Wappingers Falls, N.Y.

Filed Apr. 26, 1971, Ser. No. 137,329
Int. Cl. B44d 1/18
U.S. Cl. 117—212 4 Claims

ABSTRACT OF THE DISCLOSURE

Terminals for a semiconductive device are formed by successively depositing chromium, copper and gold through a mask into the terminal holes of the device. Wearout of the molybdenum masks employed during formation of the terminals is greatly diminished by coating the mask with a film of copper, typically 700–3000 A. units thick prior to the multimetal deposition. The cleaning solution, typically sodium cyanide, required to remove the copper-chromium-copper-gold layer from the copper coated mask is easier on the mask and causes less wearout than the solution required to remove the chromium-copper-gold deposit from uncoated molybdenum masks.

BACKGROUND OF THE INVENTION

Field of the invention

This invention relates to the manufacture of semiconductive devices wherein the terminals for such devices are simultaneously formed by a series of metal deposits through an apertured mask onto exposed regions of the semiconductive substrate material. The invention is particularly concerned with increasing the lifetime of the masks.

Description of the prior art

The manufacture of semiconductive devices, including both passive devices such as resistors, capacitors and diodes, and active devices such as transistors and integrated circuit devices, involves successive oxidation, etching, diffusion and metallization steps and the like. Towards the end of the processing procedure, the passivation layer, typically quartz, is formed on the structure, holes are etched in the passivation layer and successive layers of metal forming terminals are deposited to make ohmic contact to underlying regions of the semiconductive substrate through conductive stripes interconnected thereto. A layer of solder is then applied to the terminals which solder may be used for bonding contacts to the terminal area or act as the contacts themselves.

In the past the terminals have been formed using vacuum deposition techniques. A molybdenum mask is placed over the surface of the semiconductive device. Openings in the mask are aligned with holes in the quartz layer. Then, successive layers of chromium, copper and gold are vacuum deposited to form the terminals.

During the vacuum deposition, the chromium-copper-gold is likewise being deposited on the molybdenum mask. In order to reuse the mask, these metal deposits must be removed. I have found that the cleaning solution, typically sodium cyanide+$H_2O_2$, required to remove the chromium-copper-gold deposit from the molybdenum mask is a cause of severe mask wearout, since not only does the cleaning solution remove the multi-metal deposit, but also removes a substantial portion of the surface of the molybdenum mask about the openings in the mask. It is towards a solution to this problem that the present invention is directed.

SUMMARY OF THE INVENTION

An object of the present invention is increasing the lifetime of the mask used in forming the terminals of semiconductive devices.

These and other objects, features and advantages are accomplished in accordance with the present invention, one illustrative embodiment of which includes diminishing the wearout of molybdenum masks employed during formation of terminals on semiconductive devices by coating the mask with a parting layer, typically a film of copper, 700–3000 A. units thick prior to chromium-copper-gold deposition. The cleaning solution, typically sodium cyanide, required to remove the copper-chromium-copper-gold layer from the copper coated molybdenum mask is easier on the mask and causes less wearout than the solution used to remove the chromium-copper-gold deposit from uncoated molybdenum masks.

Another possible advantage of my invention is the increase in the lifetime of the semiconductive device itself. Prior to chromium deposition the holes in the quartz layer of the semiconductive device are cleaned by a sputter etch process. Assuming that the masks have just previously been coated with copper, then during this sputter etching some of the copper from the copper coated molybdenum mask is deposited onto the conductive stripes within the terminal holes. The stripe, normally aluminum, is thus doped with copper, thus increasing the lifetime of the stripe against failure due to electromigration.

DESCRIPTION OF THE DRAWING

The foregoing and other objects, features and advantages of the invention will be apparent from the following, more particular description of the preferred embodiments of the invention as illustrated in the accompanying drawings, wherein.

DESCRIPTION OF THE PREFERRED EMBODIMENTS

Figures 1, 2, 3, 4:
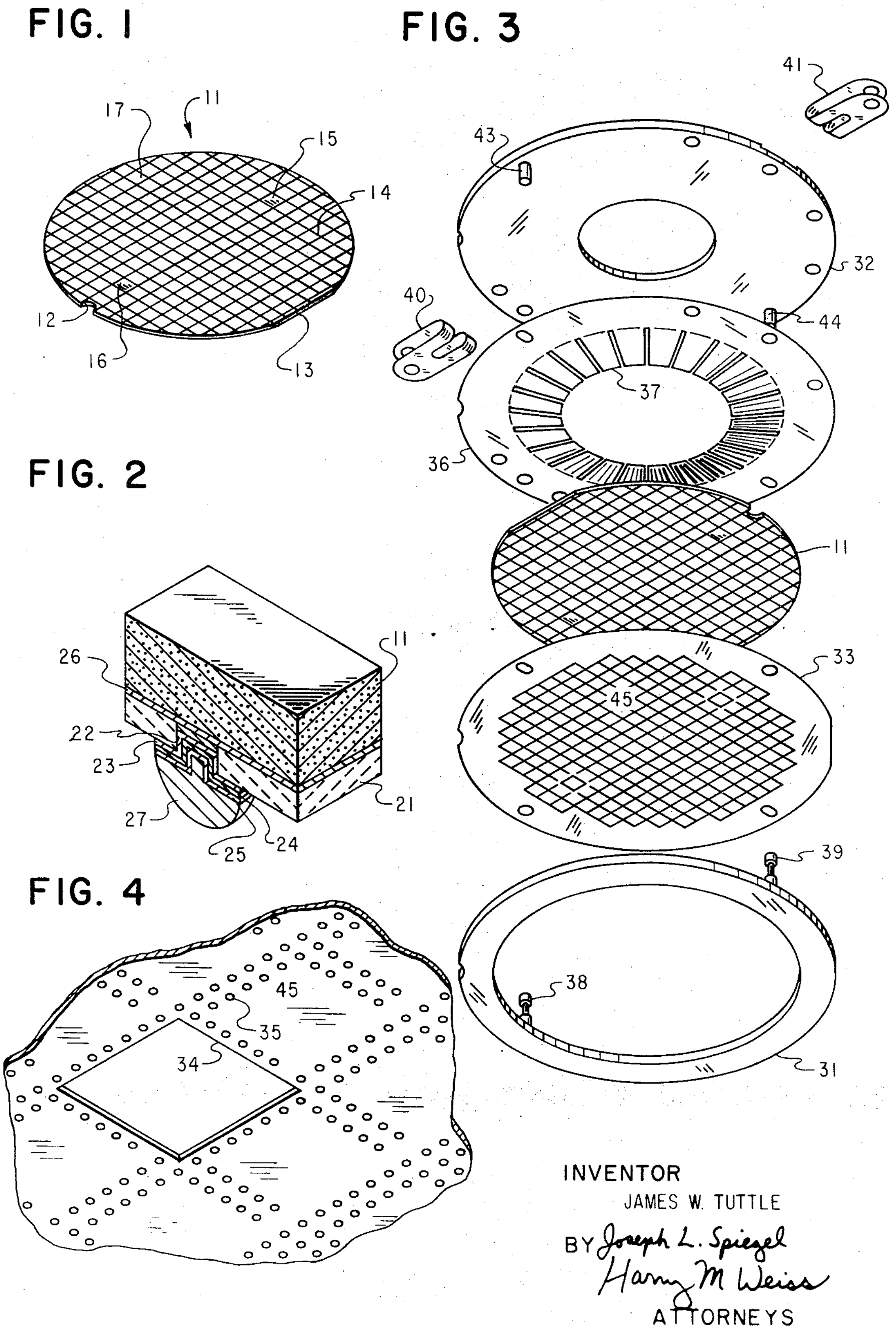
FIG. 1 is a perspective view of the active portion of a processed semiconductive wafer.
FIG. 2 shows an enlarged cross-section, broken away, of one terminal for a semiconductive wafer.
FIG. 3 is an exploded view of a mask assembly showing the novel mask in accordance with the teachings of the present invention.
FIG. 4 is an enlarged, cut away view of a portion of the novel mask of the present invention.

While not so limited, the invention finds immediate application in increasing the lifetime of masks used to form the terminals on semiconductive devices and the ensuing discussion will center on that application.

Referring now to FIG. 1 of the drawing, there is illustrated a semiconductive wafer 11. The wafer 11 is cut at two points along its periphery to form a notch 12 and flat 13 for orientation and crystallographic identification purposes. The active surface 14 of the wafer is also provided with a pair of fiducials 15, 16 for subsequent optical alignment. It is assumed, for the purpose of this explanation, that the wafer has been subjected to a series of oxidation, photolithographic masking and etching, diffusion metallization and passivation steps to partially form a plurality of semiconductive devices 17 within the wafer and that the wafer is now ready for formation of terminals and contacts.

FIG. 2 illustrates an enlarged, cross-sectional view of one terminal contact region for a processed semiconductive wafer or substrate 11. The wafer 11 has a protective or passivating layer 21 formed thereon. Holes 22 are etched in the passivating layer 21 and terminals are formed, typically successive layers of chromium 23, copper 24 and gold 25, to make ohmic contact to underlying regions of the wafer through aluminum stripes 26 interconnected thereto.

Solder 27 is then deposited on these terminals. The solder will be used for bonding contacts to the terminals or act as the contacts themselves. Apparatus for depositing the solder is described with more particularity in a co-pending application of Deverse et al., entitled "Vapor Deposition Apparatus," Ser. No. 77,453, filed Oct. 2, 1970, now U.S. Patent No. 3,670,829, and assigned to the same assignee as the present invention.

The present invention is particularly concerned with the problems which arise during that portion of the manufacturing cycle from the time that the holes 22 have been etched in the passivating layer, but before the solder has been deposited on the terminals, i.e., terminal formation.

Typically, the terminals are formed in the following manner. The wafers upon which terminals are to be formed are placed in mask assemblies. The mask assemblies are mounted on a tiered structure and placed within an evacuable chamber. The chamber is then evacuated to a pressure on the order of $3\times10^{-5}$ torr. The chamber is back-filled with Argon to a pressure of 10 microns. A voltage is applied, typically 1000 volts DC at 425 milliamperes to clean holes 22 by sputter etching. The voltage is turned off and repumped to $3\times10^{-5}$ torr. Chromium, copper and gold are then successively evaporated from a source through the mask and into the holes 22 of the passivating layer to form the terminals.

A mask assembly for holding the wafers during terminal formation is shown in FIG. 3. The assembly is shown as including: front 31 and rear 32 support plates; mask 33 with openings at 34, 35 for exposing the terminal holes 22 and fiducials 15, 16 to the metal evaporant; and, spring 36 with leaf fingers 37 that rest against the back surface of the wafer 11. A pair of orienting pins 38, 39 extend from the front plate 31 through holes in the mask 33, spring 36 and back plate 32, and clips 40, 41 snap on these pins 38, 39 to hold plates 31, 32, mask 33, spring 36 and wafer 11 firmly together. Guide pins 43, 44 which project from rear plate 32 provide additional mask assembly alignment.

The mask 33 is typically a thin metal plate. Molybdenum is a preferred metal because its thermal coefficient properties closely match that of the semiconductive material, silicon.

When forming the terminals for the semiconductive devices 17 within the wafer 11, at the same time chromium, copper and gold are being deposited in the hole 22 of a device 17, the multi-metal deposit builds up on the surface of mask 33. Before the mask 33 can be reused, this multi-metal deposit must be removed from the surface of the mask 33.

The initially deposited film, chromium, adheres very well to molybdenum. Accordingly, the cleaning solution, typically sodium cyanide+$H_2O_2$, required to remove the multi-metal deposit from the molybdenum mask 33, also eats away the molybdenum mask material causing severe mask wearout. Typically, a bare molybdenum mask may only be reused 12–18 times.

To overcome this problem, and in accordance with the teachings of the present invention, the molybdenum mask 33 is coated with a parting layer, typically a thin film 45, of copper 700–3000 A. units thick, prior to its use. The lower limit provides an effective barrier for the molybdenum mask to the subsequently deposited metallurgy. More than 3000 A. units is not required.

This coating may be applied in the following manner. The mask is placed in a mask assembly, but without a wafer. The mask assembly is mounted on a tiered structure and placed within an evacuable chamber, preferably the same chamber in which the terminals will subsequently be formed. The chamber is then evacuated to a pressure on the order of $3\times10^{-5}$ torr. Copper is then evaporated from a source onto the mask 33 creating a thin film 45 thereon, typically of a thickness on the order of 700–3000 A. thick. Alternate methods may be employed to form the copper film on the mask such as electroplating.

Subsequently, the mask assemblies are removed from the evacuable chamber, a wafer 11 is placed in the assembly 33, the assembly 33 is mounted on the tiered structure and the terminals formed as before, i.e., multi-metal deposition.

Thereafter, in order to reuse the mask 33 the multi-metal deposit must be removed from the mask's surface. To accomplish this, and in accordance with this invention, a cleaning solution of sodium cyanide is employed. This solution easily peels the copper film 45 and multi-metal deposit from the surface of the mask 33, with no adverse effect on the molybdenum mask 33. Therefore, mask life is improved. When the mask 33 has first been coated with a film 45 of copper prior to each use, such masks have been capable of reuse with good results for extended periods of time, with the removal of the multi-metal deposit no longer a factor in mask wearout.

Other possible advantages enure from the teachings of the present invention. Immediately prior to deposition of the metals which form the terminals the terminal holes 22 are cleaned by sputter etching. During this sputter etch step, some of the copper from the film 45 is deposited from the mask 33 into the terminal holes 22, thereby doping the aluminum stripes 26. Doping of the aluminum stripes 26 increases the lifetime of the stripe against failure due to electromigration.

In the preceding explanation, the parting layer formed on the mask was copper. Other metals may be employed, such as aluminum, so long as they may readily be removed from the mask without deleterious effects thereto, and so long as their presence has no adverse effects on the metallurgy for the devices being formed.

While the invention has been particularly described and shown with reference to the preferred embodiments thereof, it will be understood by those skilled in the art that various changes in form and detail and omissions may be made therein without departing from the spirit and scope of the invention.

What is claimed is:

1. A method of depositing and removing metal layers from a molybdenum mask used to form desired metalized patterns on portions of the aluminum stripes located on a silicon substrate surface comprising the steps of:

evaporating onto said molybdenum mask a copper coating having a thickness of at least about 700 A.;

evaporating onto said copper coating at least another metal layer which is not easily removable by etching without damaging said molybdenum mask; and simultaneously removing both said copper coating and said another metal layer by using an etchant which etches away said copper coating from said molybdenum mask.

2. A method in accordance with claim 1 wherein said copper coating is evaporated onto said molybdenum mask within a chamber which is evacuated to a pressure on the order of $3\times10^{-5}$ torr.

3. A method in accordance with claim 1 wherein said etchant which etches away said copper coating is sodium cyanide.

4. A method in accordance with claim 2 including the steps of:

back-filling said chamber with Argon after said copper coating has been formed on said molybdenum mask and prior to the deposition of said another metal layer; and sputter etching said silicon substrate surface in the vicinity of said copper coated molybdenum mask to form an aluminum-copper stripe having an increased lifetime against failure due to electromigration.

References Cited

UNITED STATES PATENTS

| | | | |
|---|---|---|---|
| 3,577,325 | 5/1971 | Fairchild | 117—6 X |
| 3,442,701 | 5/1969 | Lepselter | 156—2 X |
| 3,628,999 | 12/1971 | Schneble et al. | 117—6 X |
| 3,531,311 | 9/1970 | Prior | 117—6 |

EDWARD G. WHITBY, Primary Examiner

U.S. Cl. X.R.

117—217, 5.5, 6, 8.5, 119; 156—2, 17